(12) United States Patent
Wang

(10) Patent No.: US 9,093,979 B2
(45) Date of Patent: Jul. 28, 2015

(54) LATERALLY-COUPLED ACOUSTIC RESONATORS

(75) Inventor: Kun Wang, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 379 days.

(21) Appl. No.: 13/488,726

(22) Filed: Jun. 5, 2012

(65) Prior Publication Data

US 2013/0321100 A1  Dec. 5, 2013

(51) Int. Cl.
 *H03H 9/54* (2006.01)
 *H01L 41/22* (2013.01)
 *B05D 3/00* (2006.01)
 *H03H 9/58* (2006.01)

(52) U.S. Cl.
 CPC ............ *H03H 9/584* (2013.01); *H03H 9/587* (2013.01)

(58) Field of Classification Search
 CPC ............................... H03H 9/584; H03H 9/587
 USPC ........... 333/187, 195, 196; 310/313 B, 313 D
 See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,215,375 B1 | 4/2001 | Larson, III et al. | |
| 6,507,983 B1 | 1/2003 | Ruby et al. | |
| 6,650,206 B2 * | 11/2003 | Nakamura et al. | 333/193 |
| 7,280,007 B2 | 10/2007 | Feng et al. | |
| 7,388,454 B2 | 6/2008 | Ruby et al. | |
| 7,629,865 B2 | 12/2009 | Ruby | |
| 7,889,024 B2 | 2/2011 | Bradley et al. | |
| 8,084,915 B2 | 12/2011 | Hamaoka et al. | |
| 8,610,518 B1 * | 12/2013 | Solal et al. | 333/193 |
| 2006/0091978 A1 * | 5/2006 | Wang et al. | 333/189 |
| 2007/0205850 A1 | 9/2007 | Jamneala et al. | |
| 2008/0094150 A1 * | 4/2008 | Meister et al. | 333/25 |
| 2010/0188171 A1 | 7/2010 | Mohajer-Iravani et al. | |
| 2010/0327697 A1 | 12/2010 | Choy et al. | |
| 2010/0327994 A1 | 12/2010 | Choy et al. | |

FOREIGN PATENT DOCUMENTS

| | | |
|---|---|---|
| JP | 2011050020 | 3/2011 |
| WO | WO2010137648 | 12/2010 |
| WO | WO2011131844 | 10/2011 |

OTHER PUBLICATIONS

U.S. Appl. No. 13/036,489, filed Feb. 28, 2012.

* cited by examiner

*Primary Examiner* — Stephen E Jones
*Assistant Examiner* — Scott S Outten

(57) ABSTRACT

An apparatus, comprises a piezoelectric layer, a first acoustic resonator comprising first and second electrodes formed on opposite sides of the piezoelectric layer, and a second acoustic resonator comprising first and second electrodes formed on opposite sides of the piezoelectric layer and acoustically coupled to the first acoustic resonator.

32 Claims, 17 Drawing Sheets

LATERALLY-COUPLED ACOUSTIC RESONATORS

BACKGROUND

An acoustic resonator may act as a transducer that converts electrical signals into acoustic signals and/or vice versa. Examples of acoustic resonators include thin film hulk acoustic resonators (FBARs), surface acoustic wave (SAW) resonators, and bulk acoustic wave (BAW) resonators, to name but a few. These and other types of acoustic resonators can be used in a wide variety of electronic applications, such as cellular telephones, personal digital assistants (PDAs), electronic gaming devices, laptop computers, and other portable communications devices. For example, FBARs are commonly used to implement electrical filters and voltage transformers in the above and other applications.

An acoustic resonator typically comprises a layer of piezoelectric material arranged between two conductive plates or electrodes, which may form a thin membrane. Two acoustic resonators can be coupled acoustically to form a filter. When stimulated with a time-varying input signal from an input terminal of the electrodes, the piezoelectric material vibrates at a resonant frequency determined by physical properties of the acoustic resonator, such as its geometry and composition. This vibration produces a time-varying output signal at an output terminal of the electrodes.

In many applications, a filter formed with acoustic resonators is required to have a precisely-defined transfer function. For example, in an electrical filter, it may be required to transfer signals only within a specific passband. It can be difficult to precisely control the transfer function, however, due to the presence of spurious vibrational modes in the acoustic resonator. For example, an FBAR device generates longitudinal acoustic waves and lateral acoustic waves when stimulated by an applied input signal, as well as higher order harmonic mixing products. The lateral acoustic waves and higher order harmonic mixing products may cause the FBAR device to transmit energy outside of a desired passband, or they may cause it to lose energy within the desired passband. These and other features arising from the physical properties of the acoustic resonator can have a deleterious impact on functionality.

BRIEF DESCRIPTION OF THE DRAWINGS

The disclosed embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
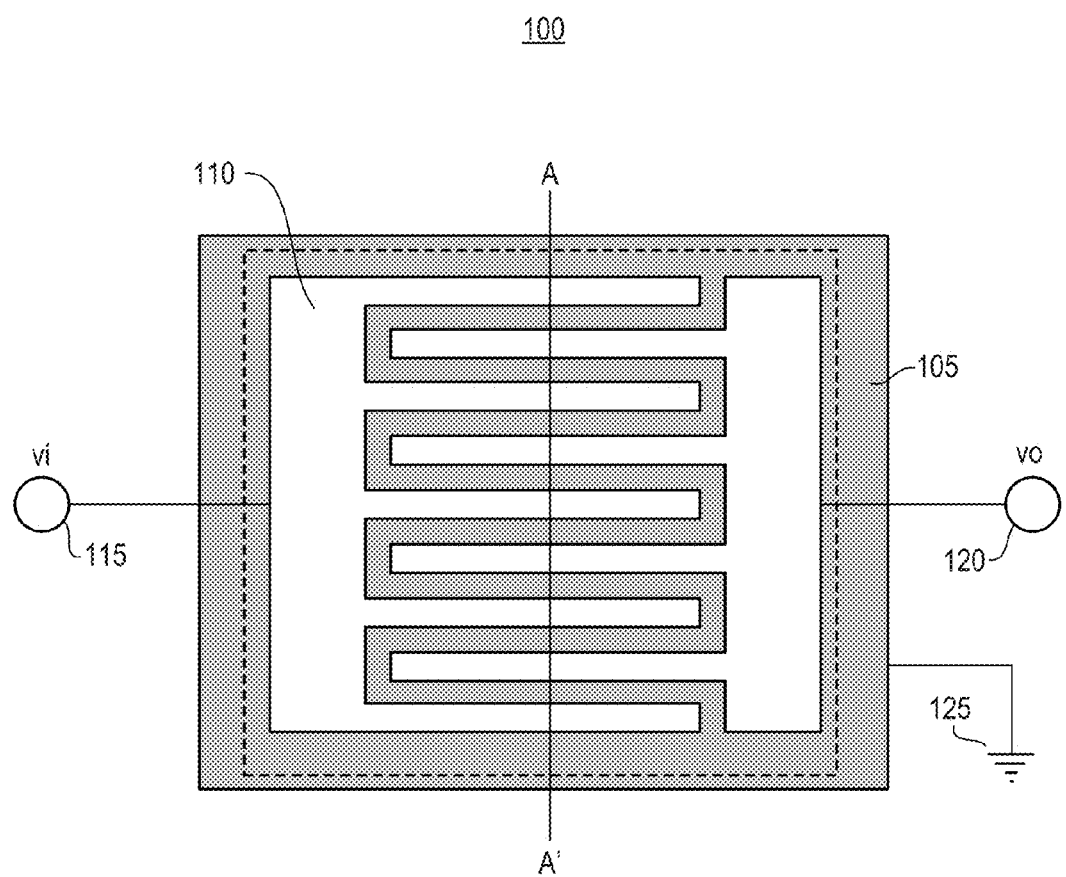
FIG. 1 is a top view of a laterally-coupled acoustic filter comprising two acoustic resonators with an interdigital electrode according to a representative embodiment.

In the following detailed description, for purposes of explanation and not limitation, representative embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper", "tower", "left", and "right" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would then be below that element.

The described embodiments relate generally to acoustic filter technologies and related methods of manufacture. In certain embodiments, an acoustic filter comprises an acoustic stack comprising a piezoelectric material formed between two electrodes, where at least one of the electrodes comprises first and second interleaved or interdigital structures corresponding to an input acoustic resonator and an output acoustic resonator. When a time-varying voltage is applied to an input terminal connected to the first interdigital structure, it excites a longitudinal mode and some lateral modes in the input acoustic resonator. The acoustic modes are acoustically coupled to the second interdigital structure, which excites the acoustic vibrations in the output acoustic resonator and produces a corresponding time-varying voltage at an output terminal connected to the second interdigital structure. The acoustical lateral coupling between the first and second interdigital structures can be used to implement a specific type of transfer function, such as a passband for an electronic filter.

Each of the first and second interdigital structures typically comprises a plurality of finger-like structures ("fingers") connected to a corresponding electrode bus. The respective fingers of the first and second interdigital structures are configured in an interdigital configuration whereby they are electrically separated from each other (i.e., they are not conductively coupled), but they are acoustically coupled through interactions with the piezoelectric material.

In various alternative embodiments, certain aspects of the electrodes can be adjusted to modify and/or improve the performance of the acoustic filter. As one example, in some embodiments, portions of the electrodes are adjusted to remove unwanted resonances that may cause attenuation (e.g., a "dip" or "valley") in a passband region of the acoustic resonator. One way to remove these resonances is by increasing the respective thicknesses of the electrode buses relative to the fingers; another way is to remove portions of one electrode that are located opposite electrode buses on the other electrode.

As another example, in some embodiments, portions of the electrodes are adjusted to eliminate spurious vibration modes that may produce unwanted gain (e.g., "peaks") outside of the passband region. The elimination of these spurious modes can be accomplished, for instance, by forming one or more of the electrodes with an apodized shape. Certain details of the use of apodization in acoustic resonators may be found in commonly owned U.S. Pat. No. 6,215,375 to Larson III, et al; or in commonly owned U.S. Pat. No. 7,629,865 entitled "Piezoelectric Resonator Structures and Electrical Filters" filed May 31, 2006, to Richard C. Ruby. The disclosures of U.S. Pat. Nos. 6,215,375 and 7,629,865 are specifically incorporated herein by reference in their entirety.

As yet another example, in some embodiments, portions of the electrodes are adjusted to improve energy confinement and/or quality factor (Q-factor) of the acoustic resonator. One such adjustment involves varying the respective thicknesses of fingers in at least one interdigital electrode. As a final example, in some embodiments, portions of both electrodes are patterned to implement unbalanced to balanced signal conversion in combination with frequency filtering. The above and other variables can be modified in other ways, adjusted in combination, or applied in numerous alternative contexts, as will be apparent to those skilled having the benefit of this written description.

The described embodiments may provide several potential benefits relative to conventional technologies. For example, certain acoustic filters described below can be produced with a smaller die size compared with conventional acoustic filters, which can reduce many factors such as the device's footprint, power consumption, and cost. Certain embodiments can also be used to efficiently implement common circuit functions such as single-ended to differential signal conversion or impedance transformation. In addition, certain embodiments can be used to implement electrical components for wide band applications. Finally, the above and other benefits can be achieved in certain embodiments by a relatively elegant (e.g., not overly complex) structure, as will be apparent from the description that follows.

Certain aspects of the described embodiments build upon components of FBAR devices, FBAR-based filters, related materials and methods of fabrication. Various details of FBARs, their materials and methods of fabrication may be found in one or more of the following U.S. patents and patent applications: U.S. Pat. No. 6,107,721 (Aug. 22, 200) to Lakin; U.S. Pat. Nos. 5,587,620 (Dec. 24, 1996), 5,873,153 (Feb. 23, 1999) 6,507,983 (Jan. 21, 2003) and 7,388,454 (Jun. 17, 2008) to Ruby, et al.; U.S. Pat. No. 7,629,865 (Dec. 8, 2009) to Ruby; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No. 2010/0327697, entitled "Acoustic Resonator Structure Comprising a Bridge" to Choy et al.; U.S. Pat. App. Pub. No. 2010/0327994, entitled "Acoustic Resonator Structure having an Electrode with a Cantilevered Portion" to Choy et al.; and U.S. patent application Ser. No. 13/036,489, entitled "Coupled Resonator Filter Comprising a Bridge" to Burak filed on Feb. 28, 2011. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

In addition to FBAR devices, some of the described embodiments could also be implemented in other types of acoustic resonators such as double bulk acoustic resonators (DBARs). Certain details of FBARs, DBARs, and other types of acoustic resonators may be found in one or more of the following commonly owned U.S. patents, patent application Publications, and patent applications: U.S. Pat. No. 6,107,721, to Lakin; U.S. Pat. Nos. 5,587,620, 5,873,153 and 6,507,983 to Ruby, et al.; U.S. Pat. No. 7,629,865 to Ruby; U.S. Pat. No. 7,280,007 to Feng, et al.; U.S. Patent Application Publication 20070205850 to Jamineala, et al.; U.S. Pat. No. 7,388,454 to Ruby, et al; U.S. Patent Application Publication 20100327697 to Choy, et al.; and U.S. Patent Application Publication 20100327994 to Choy, et al. Examples of stacked bulk acoustic resonators, as well as their materials and methods of fabrication, may be found in U.S. Pat. No. 7,889,024 to Bradley et al. The disclosures of these patents and patent applications are specifically incorporated herein by reference. The components, materials and method of fabrication described in these patents and patent applications are representative, and other methods of fabrication and materials within the purview of one of ordinary skill in the art are contemplated.

FIG. 1 is a top view of a laterally-coupled acoustic filter 100 comprising an interdigital electrode according to a representative embodiment. The interdigital electrode comprises two parts that are electrically separated but are laterally coupled through acoustical interactions with a piezoelectric layer. These two parts correspond to two acoustic resonators that are laterally coupled to form acoustic filter 100.

Referring to FIG. 1, acoustic filter 110 comprises a bottom electrode 105 and atop electrode 110. Although not shown in FIG. 1, acoustic filter 100 further comprises a piezoelectric layer formed between bottom electrode 105 and top electrode 110. An example of such a piezoelectric layer is shown in the cross-sectional view of FIG. 3, which is taken along a line A-A' in FIG. 1.

Bottom electrode 105 and top electrode 110 are typically formed of a conductive material such as tungsten or molybdenum, although various other suitable materials can be used in alternative embodiments. Bottom electrode 105 is connected to ground 125 and top electrode 110 is connected between an input terminal 115 and an output terminal 120.

Figure 12A:
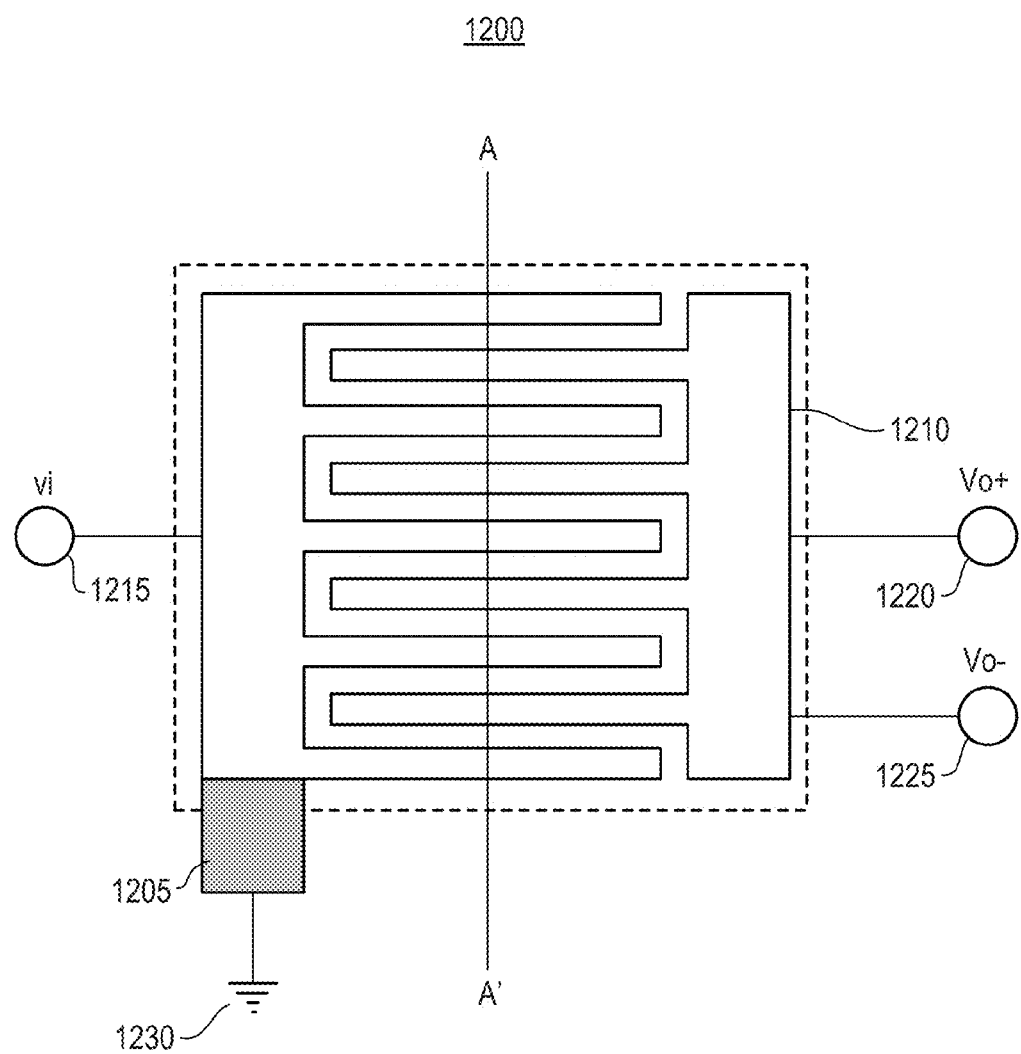
FIG. 12A is a top view of an acoustic filter comprising two laterally-coupled resonators according to a representative embodiment.
Figure 12B:
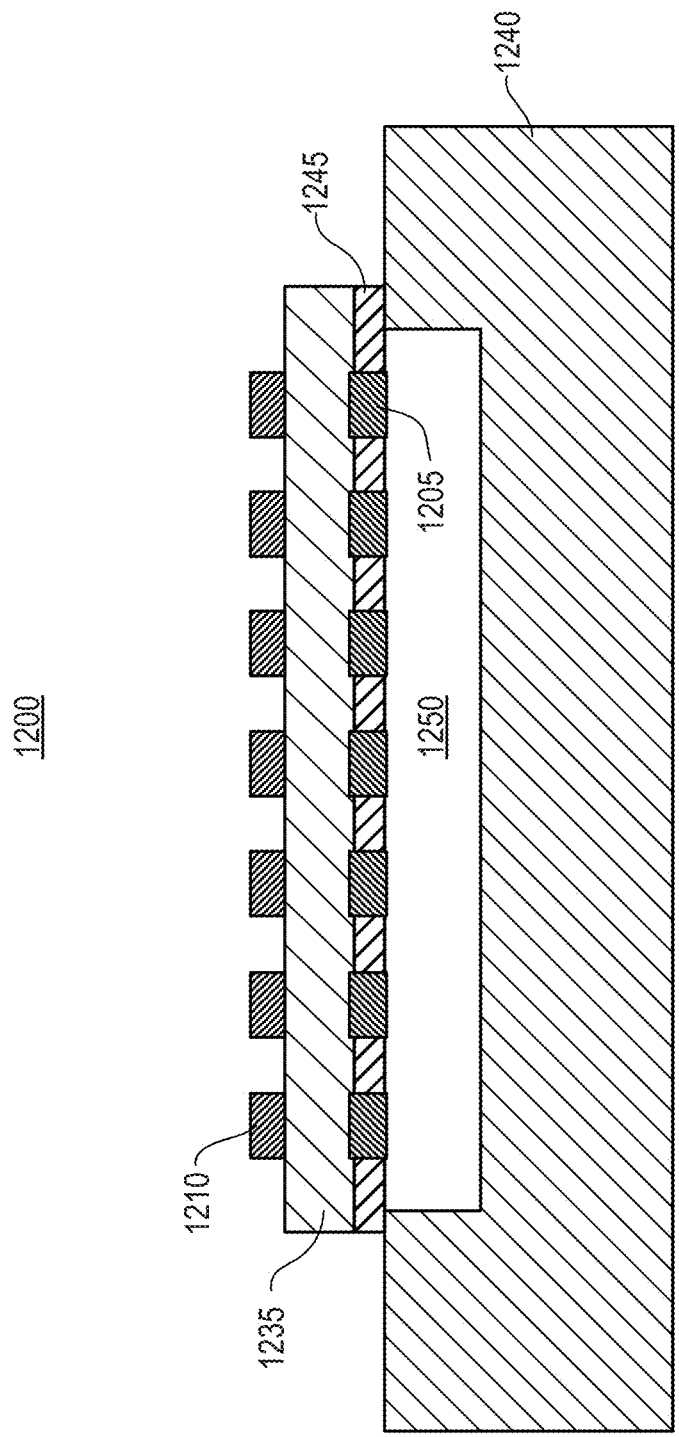
FIG. 12B is a cross-sectional view of an acoustic filter comprising two laterally-coupled resonators according to a representative embodiment.

For simplicity, bottom electrode 105 is shown in FIG. 1 and various other drawings as a single piece that functions as part of two acoustic resonators. However, in alternative embodiments, a bottom electrode can be divided into multiple electrically separate parts corresponding to multiple acoustic resonators. For example, FIGS. 12A and 12B show an acoustic filter comprising a bottom electrode formed of two electrically separate parts. Moreover, although not shown in the drawings, certain features described below, such as mass loading, removal of peripheral portions of a bottom electrode, and apodization, can be combined with a divided bottom electrode. Additionally, where a bottom electrode is divided into multiple electrically separate parts, the different parts can be connected to the same electrical potential, similar to the embodiment of FIG. 1, or they can have distinct electrical connections, similar to the embodiment of FIGS. 12A and 12B.

Top electrode 110 is formed in two parts that are electrically separated from each other but are laterally-coupled through acoustical interactions with the piezoelectric layer. These two parts include a first part ("left part") comprising a plurality of fingers connected to a first electrode bus ("left electrode bus"), and a second part ("right part") comprising a plurality of fingers connected to a second electrode bus ("right electrode bus"). The fingers of the left and right parts are arranged in an interdigital configuration. They are typically formed by patterning a layer of conductive material such as tungsten or molybdenum. The left and right parts define a left resonator and a right resonator, respectively. In the configuration shown in FIG. 1, the left resonator can also be referred to as an input resonator, and the right resonator can be referred to as an output resonator.

During typical operation of acoustic filter 100, an input signal is applied to input terminal 115. The input signal creates an electrical field between bottom electrode 105 and the left part of top electrode 110, which stimulates mechanical vibration of the piezoelectric layer. The mechanical vibration is coupled acoustically from the left resonator to the right resonator, producing an electrical signal in the right part of top electrode 110, which in turn produces an output signal on output terminal 120. In other words, the left and right parts of acoustic filter 100 are laterally coupled such that an electrical signal on the left part produces a corresponding electrical signal on the right part.

The mechanical vibrations in acoustic filter 100 typically comprise multiple modes. These modes are coupled between the left and right resonators to produce mechanical vibrations at the output resonator. This coupling may create a bandpass transfer function, for example, which can be used to implement an electrical filter or other component using such a transfer function.

Figure 2:
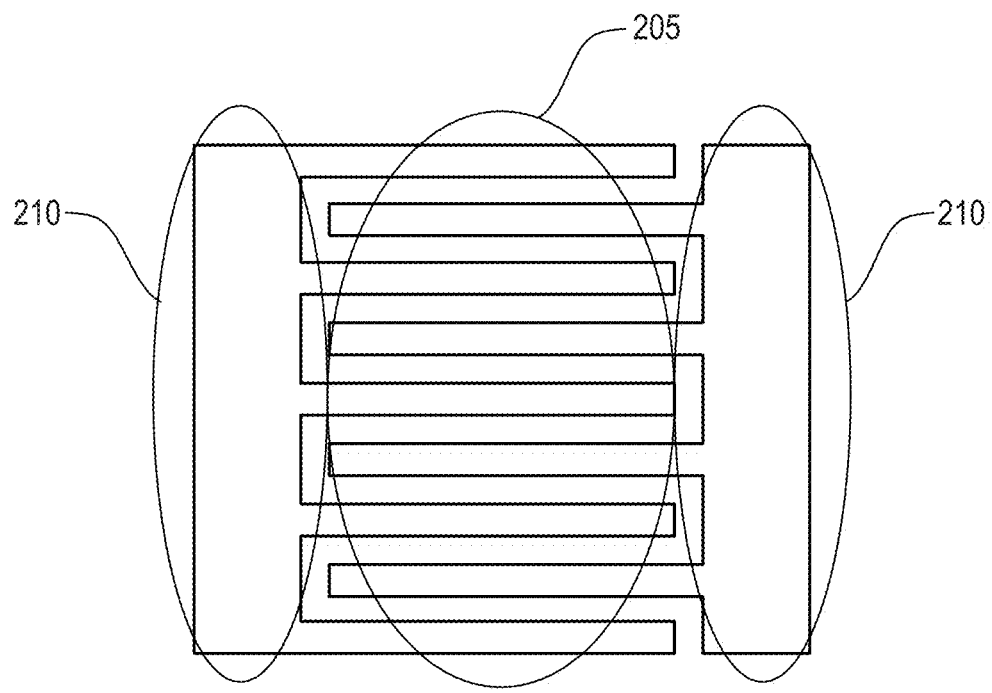
FIG. 2 is a top view of an interdigital electrode structure in the acoustic filter of FIG. 1 according to a representative embodiment.

FIG. 2 is a top view of an interdigital electrode structure in acoustic filter 100 according to a representative embodiment. This structure shown in FIG. 2 corresponds to top electrode 110 of acoustic filter 100.

Referring to FIG. 2, the interdigital electrode structure comprises an interdigital coupling section 205 and electrical buses 210. Interdigital coupling section 205 comprises a plurality of fingers, and electrode buses 210 provide electrical connections to the fingers on respective left and right parts of interdigital coupling section 205.

The frequency response of acoustic filter 100 is generally affected by physical properties of the interdigital electrode structure, such as its geometry, location, composition and the geometry of piezoelectric layer and the bottom electrode. For example, due to the structure and location of electrode buses 210, its longitudinal vibration modes may produce attenuation in the passband region of acoustic filter 100. An example of such attenuation is illustrated by a "dip" or "valley" indicated by a mark m24 in FIG. 6. As will be explained below, this attenuation, as well as other features of the frequency response, can be addressed by changing the geometry and other features of the interdigital electrode structure.

Figure 3:
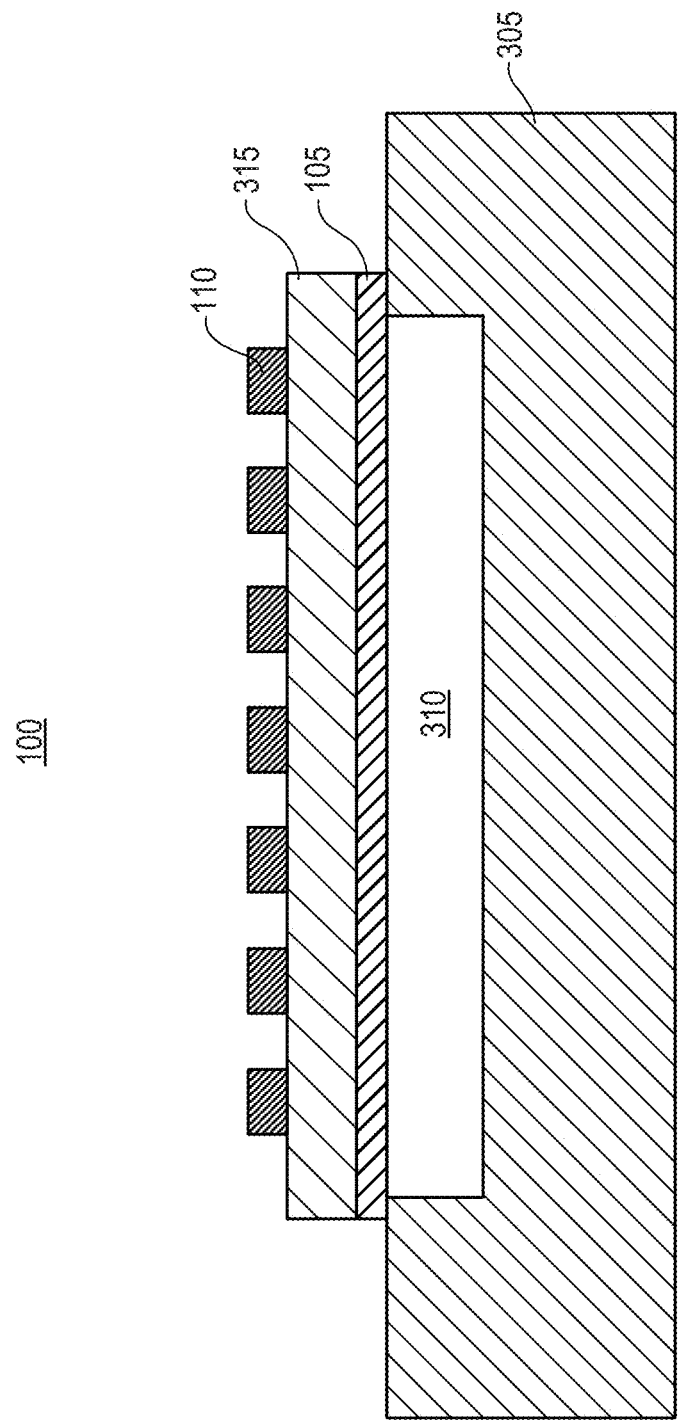
FIG. 3 is a cross-sectional view of the acoustic filter of FIG. 1 according to a representative embodiment.

FIG. 3 is a cross-sectional view of acoustic filter 100 according to a representative embodiment. This cross-sectional view is taken along the line A-A' in FIG. 1.

Referring to FIG. 3, acoustic filter 100 comprises a substrate 305, an air cavity 310, bottom electrode 105, a piezoelectric layer 315, and top electrode 110.

Substrate 305 typically comprises an electrical insulator such as a highly resistive silicon wafer. Air cavity 310 serves as an acoustic insulator between substrate 305 and an acoustic stack formed by bottom electrode 105, piezoelectric layer 315, and top electrode 110. This acoustic insulation prevents the acoustic stack from transferring energy to substrate 305 as it vibrates, which preserves the amplitude of the signal transmitted between input terminal 115 and output terminal 120 of acoustic filter 100. Air cavity 310 is typically formed by removing a sacrificial layer from an etched portion of substrate 305 after bottom electrode 105 and top electrode 110 are formed.

Bottom electrode 105 and top electrode 110 are typically formed of a conductive material such as molybdenum or tungsten. The material may vary according to the type of application in which acoustic filter 100 is used. For example, in higher frequency applications, such as 2 GHz filters, bottom electrode 105 and top electrode 110 may be formed of molybdenum, while in lower frequency applications, such as 800-900 MHz filters, they may be formed of tungsten. In a typical implementation, bottom and top electrodes have a thickness of about 6000 angstroms, although these dimensions are merely one example.

Piezoelectric layer 315 typically comprises a piezoelectric material such as aluminum nitride or zinc oxide. In a typical implementation, piezoelectric layer 315 has a thickness of about 1.5 microns, although this dimension is merely one example.

Acoustic filter 100 can be manufactured using any of various alternative techniques that will be apparent to those skilled in the art in view of this written description. Some of the described techniques and related materials will be presented in simplified fashion, e.g., by omitting certain steps, components, variations, or nuances that are well known in the art. Moreover, the described techniques and materials are presented as examples and could be replaced with suitable substitutes in alternative embodiments. As one example, air cavity 310 could be replaced with another type of acoustic insulator or reflector, such as a Bragg reflector.

Figure 4:
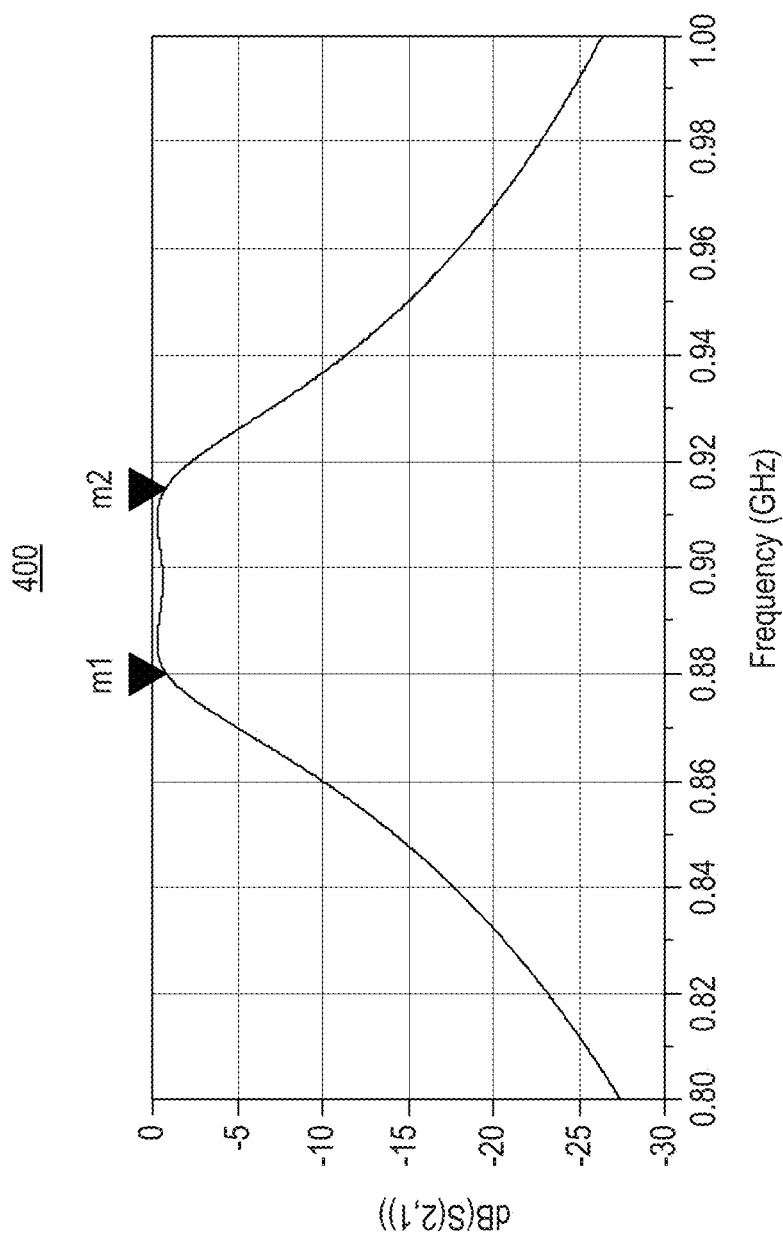
FIG. 4 is a graph illustrating the simulated performance of an acoustic filter comprising two laterally-coupled resonators according to a representative embodiment.

FIG. 4 is a graph 400 illustrating a transfer function of a simulated acoustic filter comprising a laterally-coupled resonator pair according to a representative embodiment. The simulated acoustic resonator pair has a structure similar to acoustic filter 100, with a top electrode comprising a pair of interdigital structures. The acoustic filter was simulated with a coupling coefficient of 3.8% between the laterally-coupled resonator pair.

Referring to FIG. 4, the transfer function represents frequency-based variation of the output power of the simulated acoustic filter divided by the input power of the simulated acoustic filter. As indicated by the shape of the transfer function, the simulated acoustic filter operates as a bandpass filter with a passband between frequencies of about 880 MHz and 915 MHz. These frequencies are labeled with corresponding marks m1 and m2. The bandpass characteristic is created by excitation of the mechanical vibration modes in one of the interdigital structures, and acoustic coupling of the modes to the other interdigital structure to excite the mechanical vibration modes at the output of the acoustic filter.

As explained below with reference to FIGS. 6 and 9, the transfer function of the simulated acoustic filter may differ from that of an actual acoustic filter. Differences may arise, for example, as a consequence of spurious vibration modes or other forms of noise.

Figure 5:
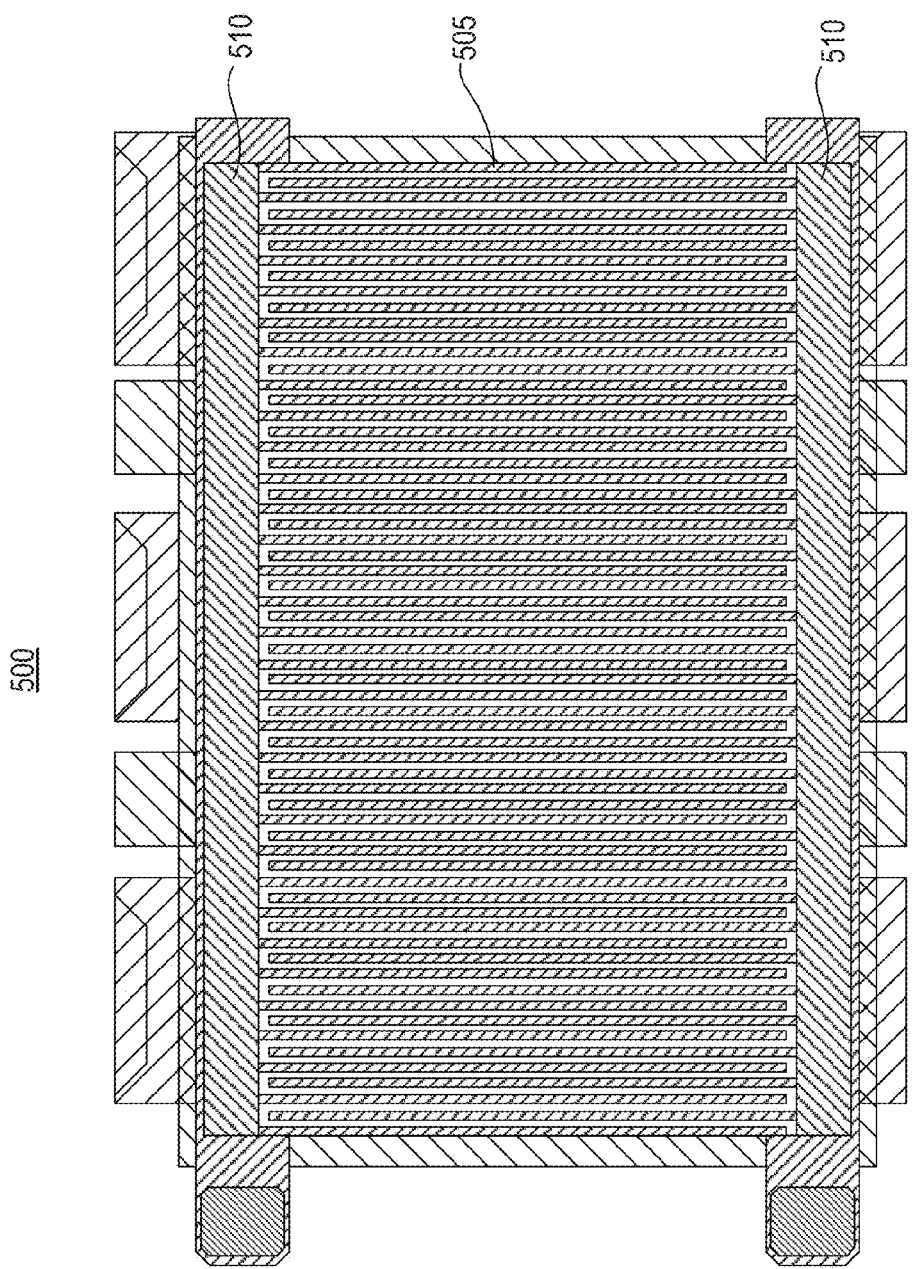
FIG. 5 is a schematic view of an acoustic filter comprising two laterally-coupled resonators according to a representative embodiment.

FIG. 5 is a schematic view of an acoustic filter 500 comprising a laterally-coupled resonator pair according to a representative embodiment. This view is presented in order to show an implementation of an interdigital electrode structure, and it is not intended to illustrate other features. Accordingly, for the sake of simplicity, other features of acoustic titter 500 will not be described.

Referring to FIG. 5, acoustic filter 500 comprises an interdigital electrode structure formed by finger structures 505 connected electrode buses 510. As illustrated in FIG. 5, the number of finger structures 505 is far greater than the number of finger structures illustrated in FIGS. 1 and 2, for instance. Moreover, unlike acoustic filter 100 of FIG. 1, which is a conceptual illustration, acoustic filter 500 represents an actual device.

Figure 6:
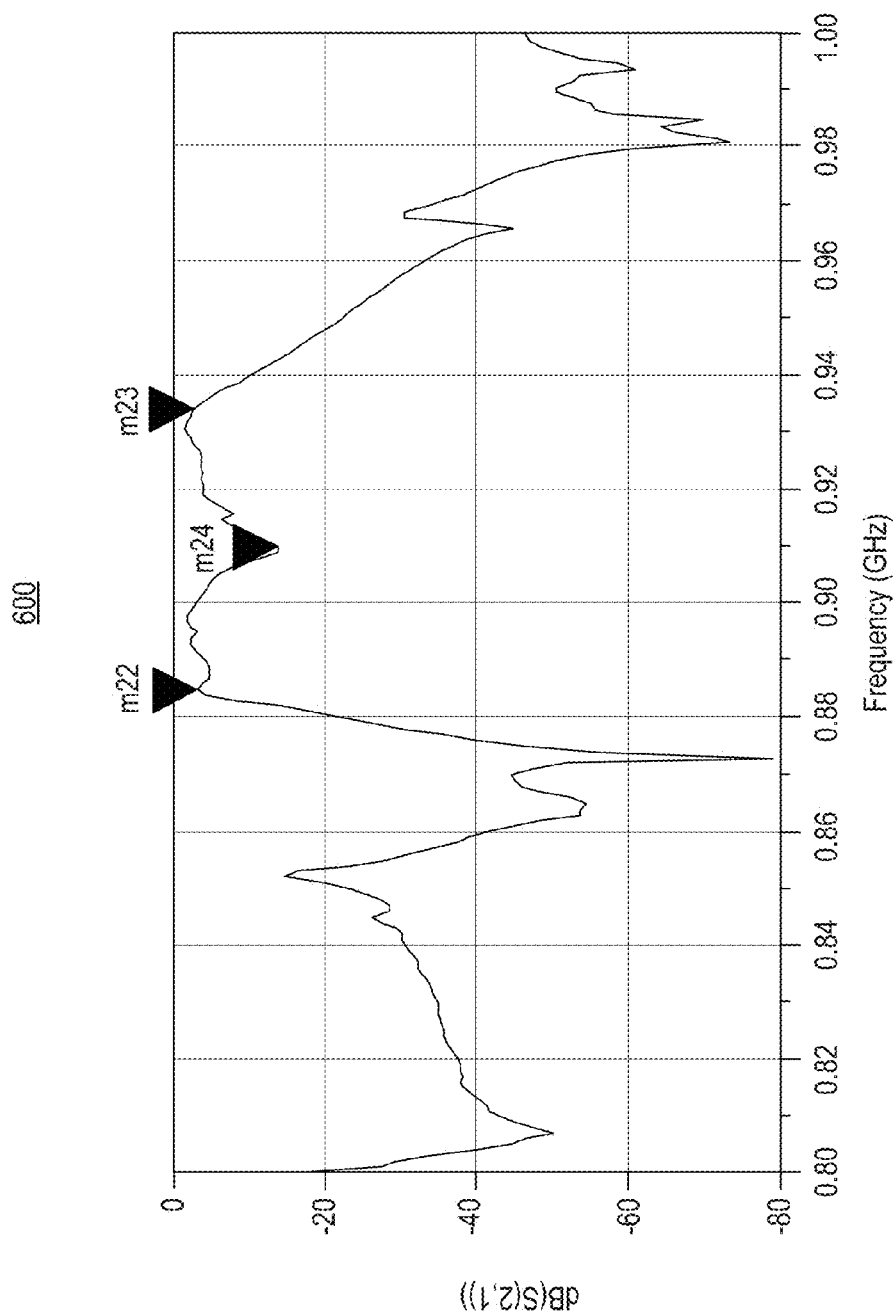
FIG. 6 is a graph illustrating the measured performance of an acoustic filter having the design illustrated FIG.

FIG. 6 is a graph 600 illustrating the measured performance of an acoustic resonator having the design illustrated in FIG. 1. The acoustic resonator used to generate the graph of FIG. 6 has an interdigital structure with finger structures that are 6 microns wide and are separated by 6 microns.

Referring to FIG. 6, graph 600 is similar to graph 400 of FIG. 4 in that it has a passband in the 900 MHz range. In particular, it has a passband between a first mark m22 at about 885 MHz and a second mark m23 at about 935 MHz. However, unlike graph 400, there is a dip in the middle of the passband, as indicated by a mark 24. This dip is believed to be a consequence of a longitudinal mode of an electrode bus such as electrode buses 210 of FIG. 2. The dip is generally undesirable because it represents attenuation at the center of the passband. FIGS. 7 and 8 illustrate various techniques for addressing the dip shown in FIG. 6. In addition, there are peaks outside of the passband, which may be undesirable as well because they can allow noise to be transmitted to the output of the acoustic filter. FIGS. 10 through 13 illustrate various techniques for addressing the peaks outside the passband.

Figure 7A:
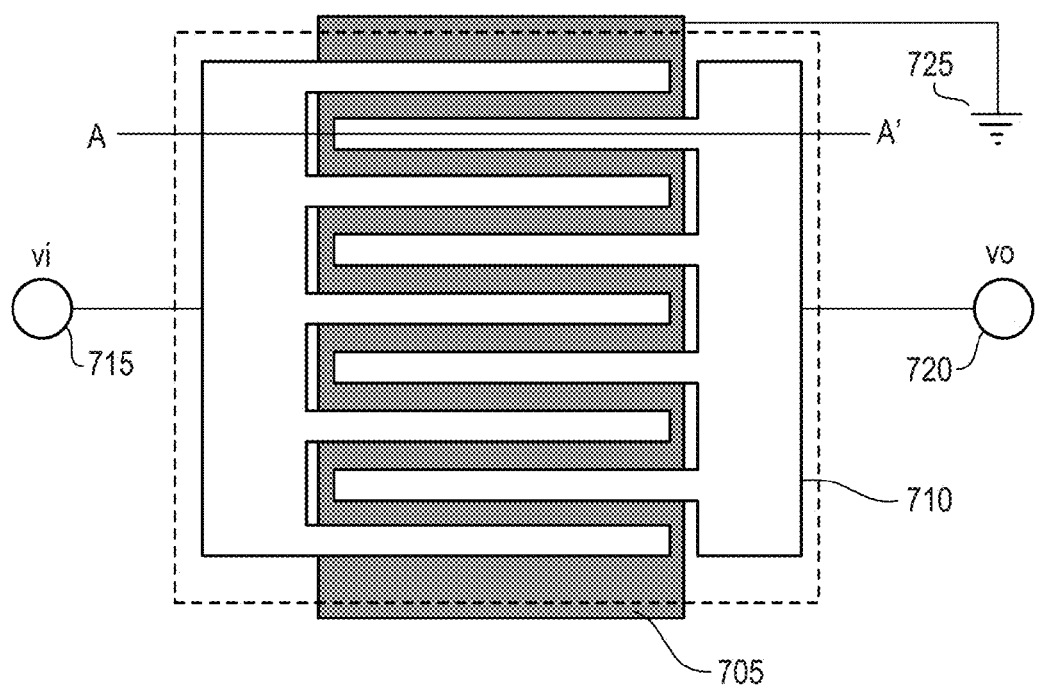
FIG. 7A is a top view of an acoustic filter comprising two laterally-coupled resonators according to a representative embodiment.
Figure 7B:
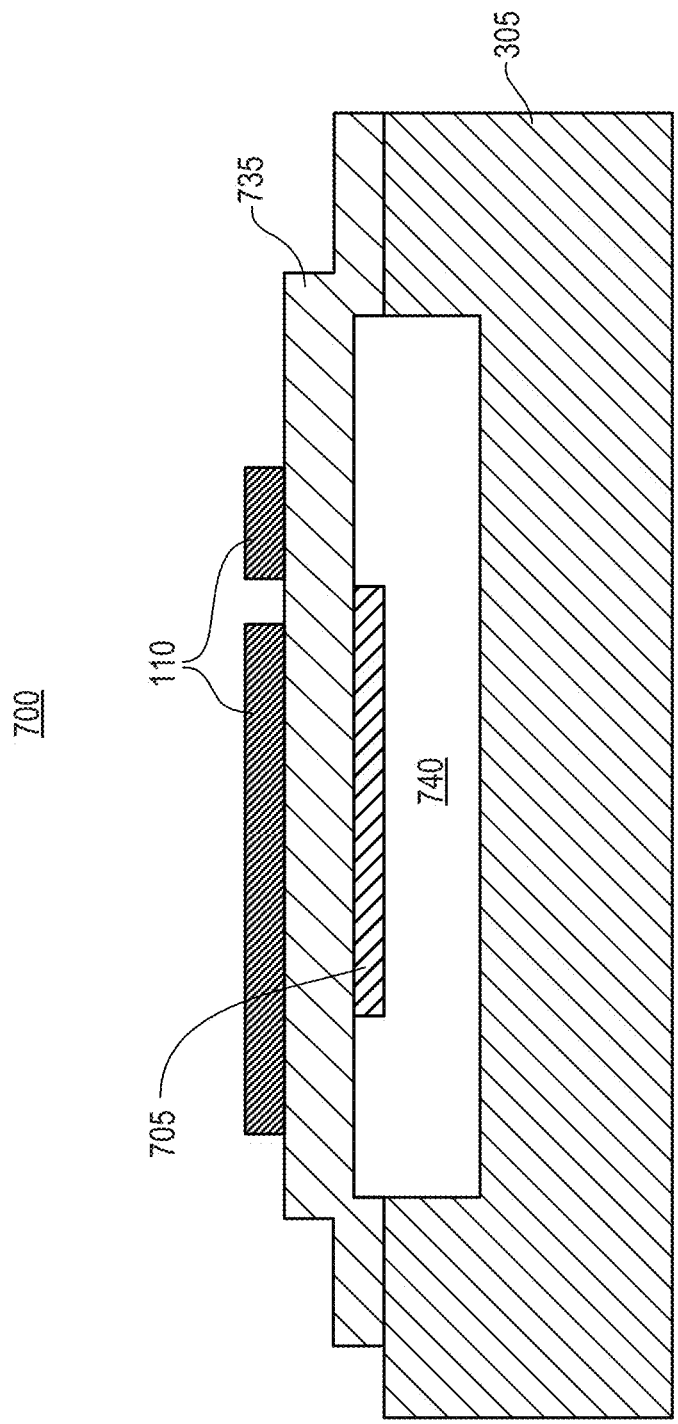
FIG. 7B is a cross-sectional view of the acoustic filter of FIG. 7A according to a representative embodiment.

FIG. 7A is a top view of an acoustic filter 700 comprising a laterally-coupled resonator pair according to a representative embodiment, and FIG. 7B is a cross-sectional view of acoustic filter 700 according to a representative embodiment. The cross-sectional view of FIG. 7B is taken along a line A-A' in FIG. 7A.

Acoustic filter 700 is similar to acoustic fitter 100 of FIG. 1, except that a portion of the bottom electrode is eliminated below the electrode buses. The elimination of this portion of the bottom electrode can remove some of the noise that causes the dip shown in FIG. 6. In particular, it can remove noise caused by the longitudinal vibration modes of the electrode buses.

Referring to FIG. 7A, acoustic filter 700 comprises a bottom electrode 705, a top electrode 710, an input terminal 715, and an output terminal 720. Bottom electrode 705 is connected to ground 725, and top electrode 710 is connected between input terminal 715 and output terminal 720. Top electrode 710 comprises left and right electrode buses and corresponding fingers. Bottom electrode 705 is formed below the fingers but not below the electrode buses.

Referring to FIG. 7B, acoustic filter 700 further comprises a substrate 730, an air cavity 740, and a piezoelectric layer 735. Bottom electrode 705 is formed in air cavity 740 between substrate 730 and piezoelectric layer 735. Although not shown, bottom electrode 705 is typically supported by a portion of substrate 730 outside of air cavity 740.

Figure 9A:
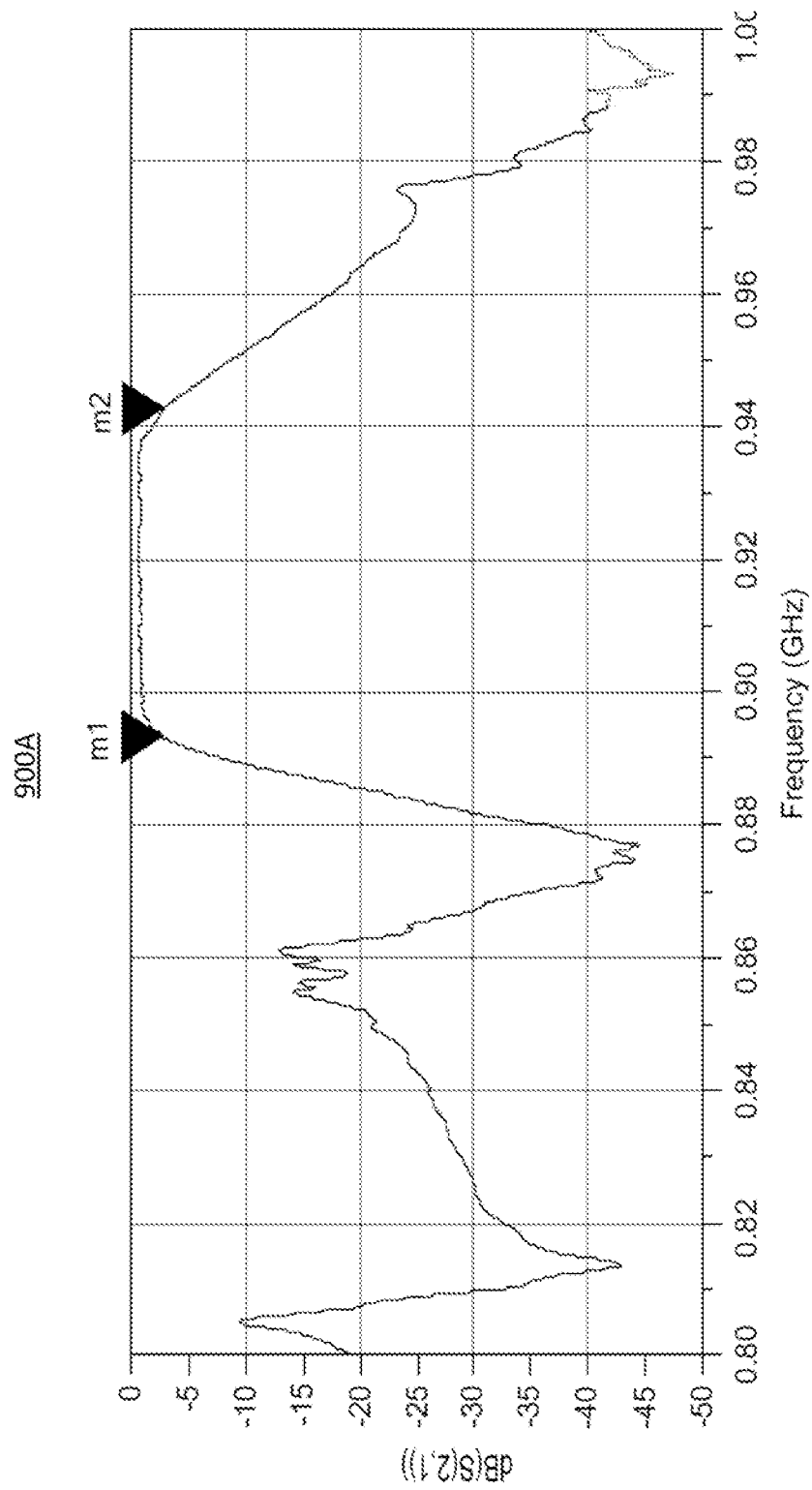
FIG. 9A is a graph illustrating the measured performance of an acoustic filter having the design illustrated in FIG. 7.

An active region is formed in acoustic fitter 700 where bottom electrode 705 and top electrode 710 overlap. Acoustic vibrations are generated within the active region and are substantially damped outside the active region. This prevents the electrode buses of top electrode 710 from interfering with the transfer function of acoustic filter 700, which can reduce or eliminate the dip illustrated in FIG. 6. To illustrate the impact of removing a portion of bottom electrode 705 below the electrode buses of top electrode 710, FIG. 9A shows a transfer function of an acoustic resonator having this feature. As explained below, the transfer function of FIG. 9A shows better performance within the passband region compared with the transfer function of FIG. 6.

Figure 8A:
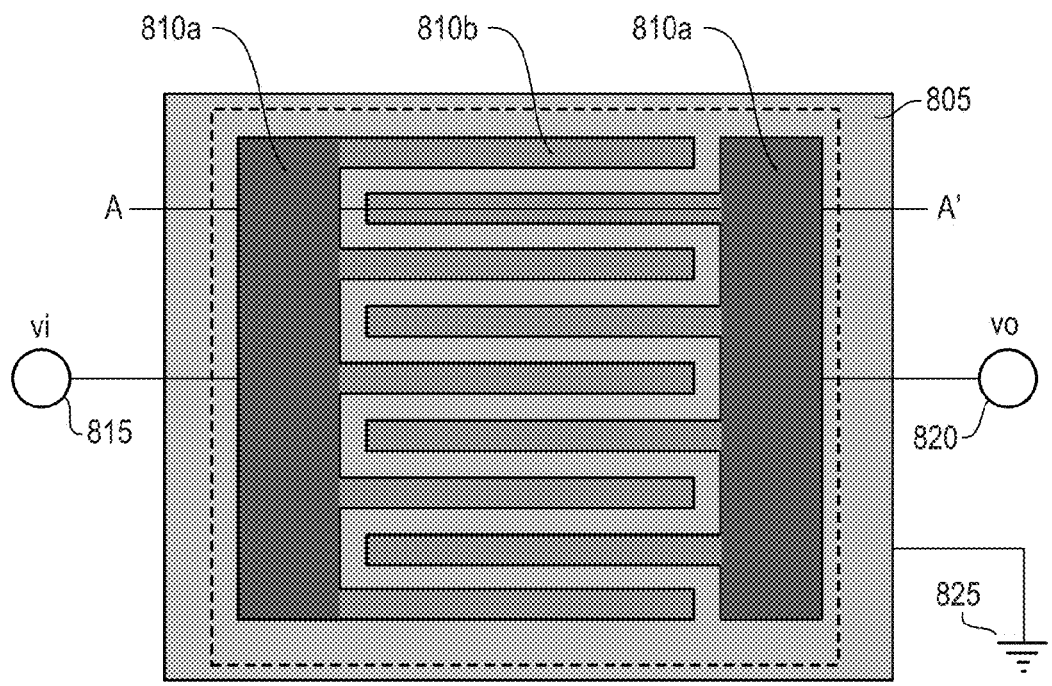
FIG. 8A is a top view of an acoustic filter comprising a laterally-coupled resonator according to a representative embodiment.
Figure 8B:
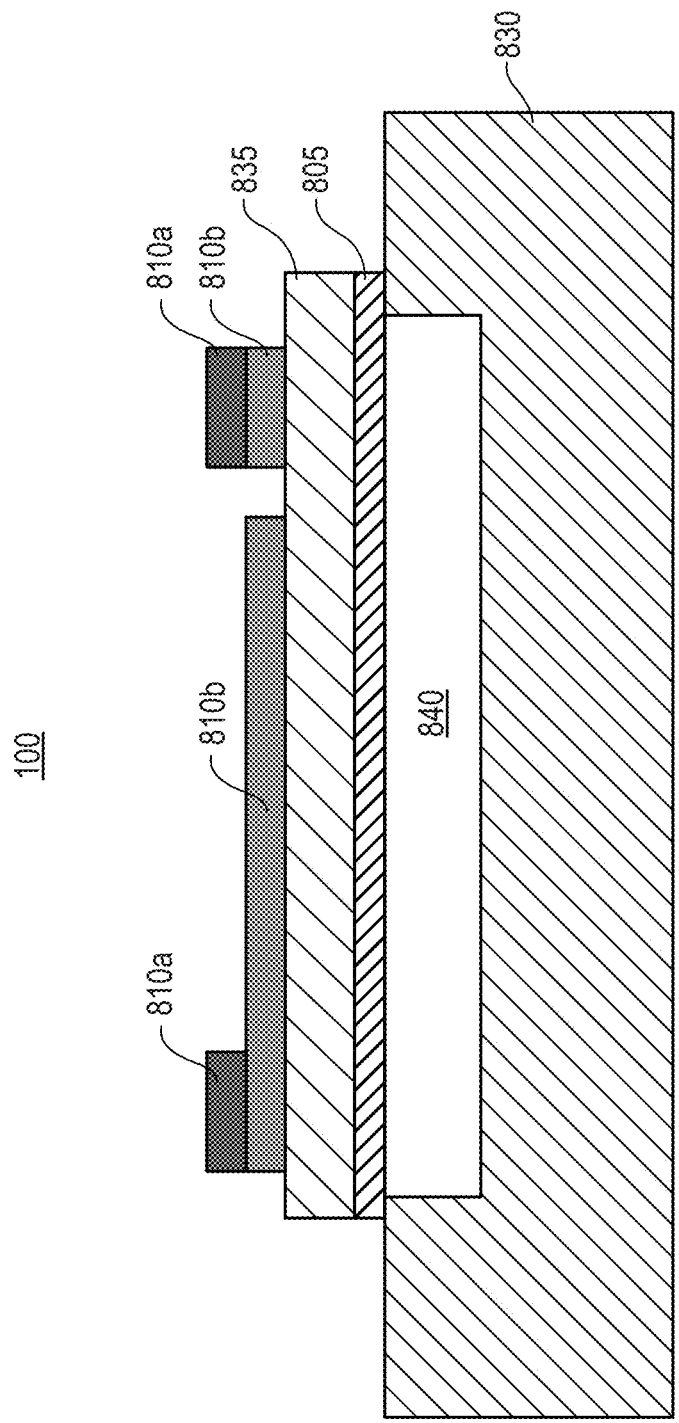
FIG. 8B is a cross-sectional view of the acoustic filter of FIG. 8A according to a representative embodiment.

FIG. 8A is a top view of an acoustic filter 800 comprising a pair of laterally-coupled resonators according to a representative embodiment, and FIG. 8B is a cross-sectional view of acoustic filter 800 according to a representative embodiment. The cross-sectional view of FIG. 8B is taken along a line A-A' in FIG. 8A.

Acoustic filter 800 is similar to acoustic filter 100 of FIG. 1, except that electrode buses of the top electrode are formed significantly thicker than other portions of the top electrode. For example, the electrode buses may be formed about twice as thick as the fingers at the middle of the top electrode. The addition of this thickness may also be referred to as "mass loading" of the electrode buses. This mass loading of the electrode buses shifts their resonant frequency away from the passband of acoustic filter 800.

Referring to FIG. 8A, the top view of acoustic filter 800 appears substantially the same as the top view of acoustic filter 100 of FIG. 1. In particular, the top view shows a bottom electrode 805, a top electrode 810, an input terminal 815, and an output terminal 820. Bottom electrode 805 is connected to ground 825, and top electrode 810 is connected between input terminal 815 and output terminal 820.

Referring to FIG. 8B, acoustic filter 800 further comprises a substrate 830, an air gap 840 between substrate 830 and bottom electrode 805, and a piezoelectric layer 835 between bottom electrode 805 and top electrode 810. Top electrode 810 comprises a portion 810A and a portion 810B, which have different thicknesses. For example, in some embodiments, portion 810A has a thickness of about 6000 angstroms, and portion 81013 has a thickness of about 12000 angstroms.

Figure 9B:
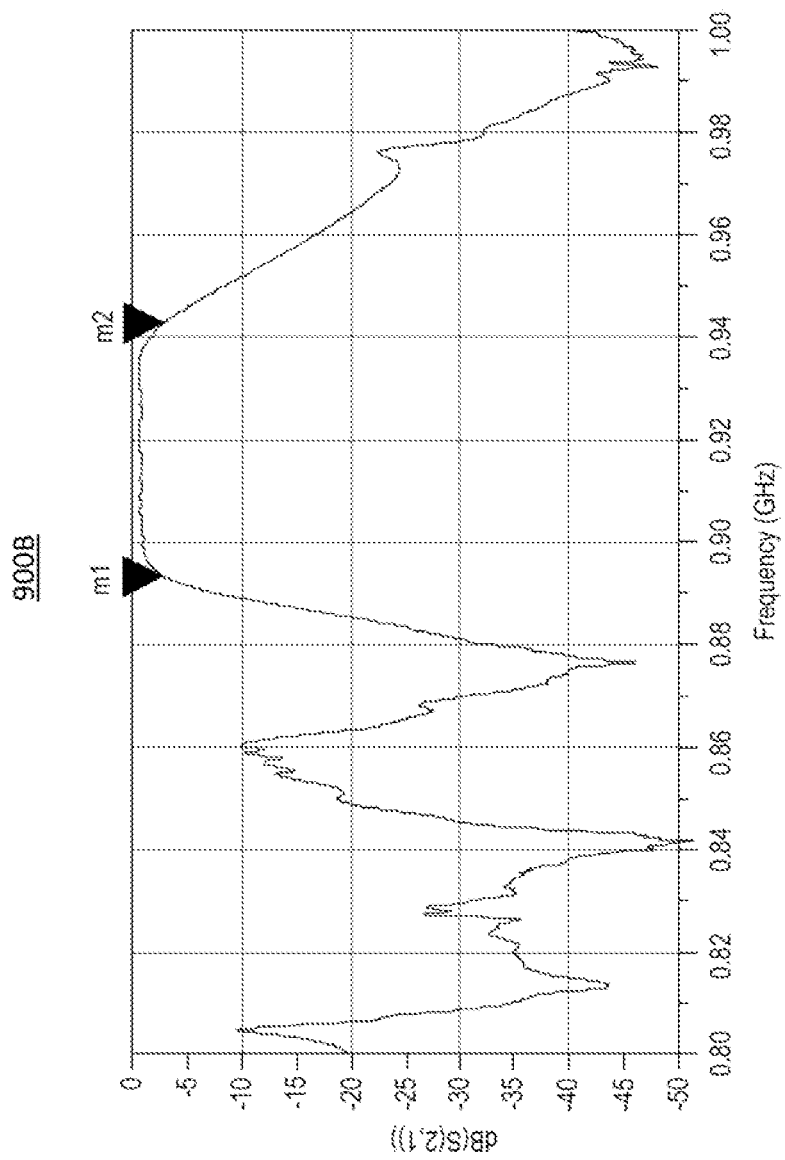
FIG. 9B is a graph illustrating the measured performance of an acoustic filter having the design illustrated in FIG. 8.

The increased thickness of top electrode 810 tends to change the overall frequency response of acoustic filter 800. For example, it can prevent a dip in the passband of acoustic filter 800, such as that illustrated in FIG. 6. To illustrate the impact of mass loading the electrode buses in acoustic filter 800, FIG. 9B shows a transfer function of an acoustic filter having this feature. As explained below, the transfer function of FIG. 9B shows better performance within the passband region compared with the transfer function of FIG. 6.

FIG. 9A is a graph 900A illustrating a transfer function of a measured acoustic filter having the design illustrated in FIG. 7, and FIG. 9B is a graph 900A illustrating a transfer function of a measured acoustic fitter having the design illustrated in FIG. 8.

Referring to FIGS. 9A and 9B, both of the transfer functions have a passband located roughly between 890 MHz, as indicated by a first mark m1, and 950 MHz, as indicated by a second mark m2. Moreover, unlike the transfer function shown in FIG. 6, the transfer functions in FIGS. 9A and 913 do not have a dip within their respective passbands. The absence of the gap can be attributed to the respective geometric variations shown in the designs of FIGS. 7 and 8, namely the removal of parts of bottom electrode 705 as shown in FIG. 7B, and the mass loading of top electrode 810 as shown in FIG. 8B.

Although the designs illustrated in FIGS. 7 and 8 avoid a dip in their respective passbands, they are nevertheless susceptible to spurious modes that can cause peaks outside of the passbands. For example, graph 900 in FIG. 9 shows several large peaks to the left of the passbands of the two transfer functions. Among those peaks, some experience as little as 10 dB of attenuation relative to the passband, which can result in significant noise in the output of the corresponding acoustic filters. Accordingly, additional variations of the acoustic filters of FIG. 1-8 may be required to address the spurious modes.

Figure 10:
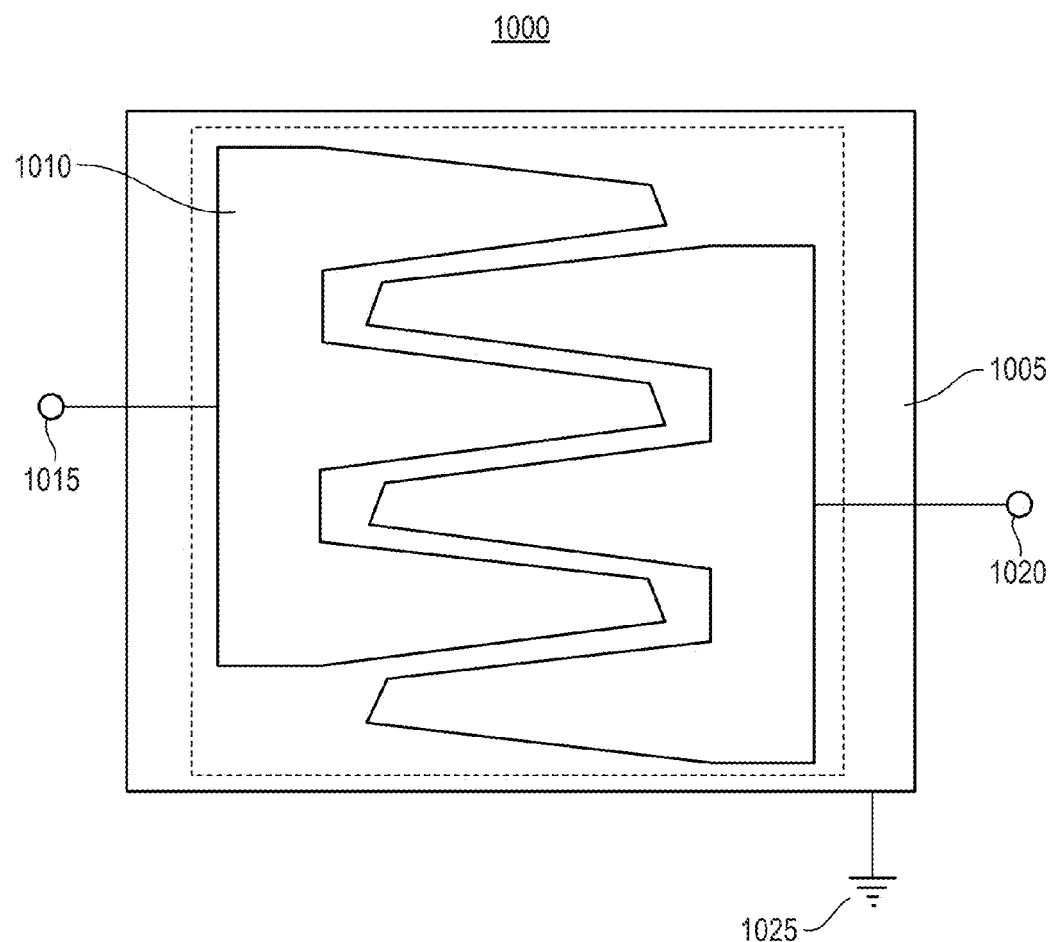
FIG. 10 is a top view of an acoustic filter comprising two laterally-coupled resonators according to a representative embodiment.

FIG. 10 is a top view of an acoustic filter 1000 comprising a laterally-coupled resonator pair according to a representative embodiment. The laterally-coupled electrode of acoustic filter 1000 has an apodized shape, which can potentially reduce or eliminate spurious modes, such as those associated with the peaks on the left side of FIG. 9.

In general, an acoustic resonator having an electrode with a rectangular shape may be prone to spurious modes. Moreover, in the example of a laterally-coupled resonator pair, it is generally beneficial to keep the acoustic resonator in one dominant piston mode so when the two sides of the electrode are coupled only the dominant mode propagates. Accordingly, one way to suppress the spurious modes in a laterally-coupled acoustic resonator pair is to form it with fingers having non-parallel edges. This non-parallel configuration is referred to as an apodized shape.

Referring to FIG. 10, acoustic filter 1000 comprises a bottom electrode 1005 and a top electrode 1010. Bottom electrode 1005 is connected to ground 1025, and top electrode 1010 is connected between an input terminal 1015 and an output terminal 1020. Bottom electrode 1005 is formed with a rectangular shape, similar to various embodiments described above.

Top electrode 1010 is formed in two parts that are electrically separated from each other but are laterally-coupled through acoustic interactions with a piezoelectric layer. Like other embodiments described above, the two parts of top electrode 1010 include a left part comprising a plurality of fingers connected to a left electrode bus, and a right part comprising a plurality of fingers connected to a right electrode bus, with the fingers of the left and right sides arranged in an interdigital configuration. In contrast to other embodiments, however, the fingers of top electrode 1010 have edges that are formed in a non-parallel configuration. With this configuration, top electrode 1010 is considered to have an apodized shape, which can suppress spurious modes such as those associated with the peaks on the left side of FIG. 9.

Figure 11:
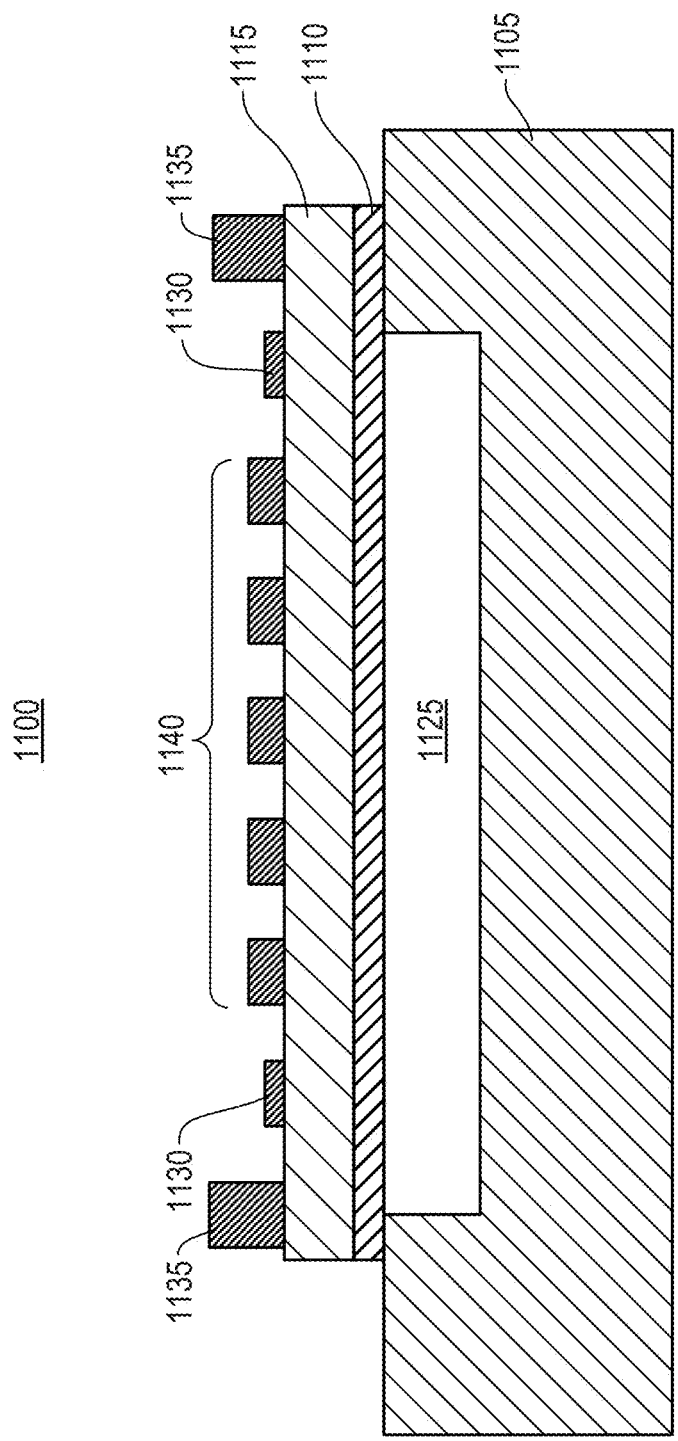
FIG. 11 is a cross-sectional view of an acoustic filter comprising two laterally-coupled resonators according to a representative embodiment.

FIG. 11 is a cross-sectional view of an acoustic filter 1100 comprising a laterally-coupled electrode according to a representative embodiment. Acoustic fitter 1100 is similar to acoustic filter 100 of FIG. 1, except that outer fingers are formed with different thicknesses. In particular, outermost fingers are formed with increased thickness, and next-outermost fingers are formed with decreased thickness. These thickness variations can prevent energy from leaking out of the active region during operation, which can preserve signal amplitude and improve the Q-factor of acoustic filter 1100.

Referring to FIG. 11, acoustic filter 1100 comprises a substrate 1105, a bottom electrode 1110, an air cavity 1125 formed in substrate 1105 below bottom electrode 1110, a piezoelectric layer 1115 formed on bottom electrode 1110, and a top electrode comprising fingers 1130, 1135, and 1140. From a top view, acoustic filter 3100 may appear similar to acoustic filter 100, for example, with the top electrode having left and right sides connected to corresponding left and right electrode buses.

The top electrode of acoustic filter 1100 comprises fingers 1140 located at a central portion of its active region, fingers 1130 located at a near-outermost portion of the active region, and fingers 1135 located at an outermost portion of the active region. Fingers 1140 have a first thickness, fingers 1130 have a second thickness less than the first thickness, and fingers 1135 have a third thickness greater than the second thickness. The different thickness variations shown in FIG. 11 are merely examples, and could be modified in alternative embodiments. For example, more than one set of fingers 1130 could be formed with the second thickness, or more than one set of fingers 1135 could be formed with the third thickness. Moreover, although not shown in the drawings, other dimension of the fingers could be adjusted to different sizes as well, such as their respective widths or spacing.

FIG. 12A is a top view of an acoustic filter 1200 comprising a laterally-coupled resonator pair according to a representative embodiment, and FIG. 12B is a cross-sectional view of acoustic filter 1200 according to a representative embodiment. The cross-sectional view shown in FIG. 12B is taken along a line A-A' in FIG. 12A. In the example shown in FIGS. 12A and 1213, acoustic filter 1200 is configured to perform unbalanced to balanced signal conversion in combination with frequency filtering.

Referring to FIG. 12A, acoustic filter 1200 comprises a bottom electrode 1205 and a top electrode 1210. Bottom electrode 1205 and top electrode 1210 substantially overlap when viewed from the top direction (i.e., they are configured to substantially "mirror" each other), so a portion of bottom electrode 1205 has been intentionally shifted in FIG. 12A to indicate its presence below top electrode 1210. The left side of top electrode 1210 is connected to an input terminal 1215 and the left side of bottom electrode 1205 is connected to ground 1230. Input terminal 1215 and ground 1230 form a single-ended input port. The right side of top electrode 1210 is connected to an output terminal 1220 and the right side of bottom electrode is connected to an output terminal 1225 on the other side, forming a balanced output.

Bottom electrode 1205 and top electrode 1210 are both formed in left and right parts, which are electrically isolated from each other, similar to top electrode 110 of acoustic filter 100. The left and right parts of both electrodes comprise electrode buses and corresponding fingers arranged in an interdigital configuration, and they are laterally-coupled with each other through acoustical interactions with a piezoelectric layer 1235 shown in FIG. 12B. The composition and manufacture of bottom electrode 1205 and top electrode 1210 can be similar to bottom electrode 105 and top electrode 110 of acoustic filter 100, except that bottom electrode 1205 is patterned in a manner similar to top electrode 1210.

Referring to FIG. 12B, acoustic filter 1200 further comprises a substrate 1240, an air cavity 1250 formed in substrate 1240, piezoelectric layer 1235 formed between bottom electrode 1205 and top electrode 1210, and an insulator 1245 formed between the fingers of bottom electrode 1205. The respective left parts of bottom electrode 1205 and top electrode 1210, in combination with corresponding portions of other structures such as piezoelectric layer 1235, form a resonator that is electrically separate from the respective right parts of those electrodes. Accordingly, these features can be referred to collectively as an input resonator of acoustic filter 1200. Similarly, the respective right parts of bottom electrode 1205 and top electrode 1210, in combination with corresponding portions of other structures such as piezoelectric layer 1235, form a resonator that is electrically separate from the respective left parts of those electrodes. Accordingly, these features can be referred to collectively as an output resonator of acoustic filter 1200.

During typical operation of acoustic filter 1200, an input signal is applied to input terminal 1215, which creates resonance in the input resonator. This resonance is coupled acoustically to the output resonator, which in turn creates two output signals of opposite polarity on output terminal 1220 and output terminal 1225, respectively. These output signals can be generated with transfer functions designed for a specific purpose, such as a passband transfer function for an electronic filter. Moreover, the input signal is received in an unbalanced form, and the output signals are generated in a balanced form, so acoustic filter 1200 can operate in combination as both a frequency filter and an unbalanced to balanced signal converter.

Figure 13:
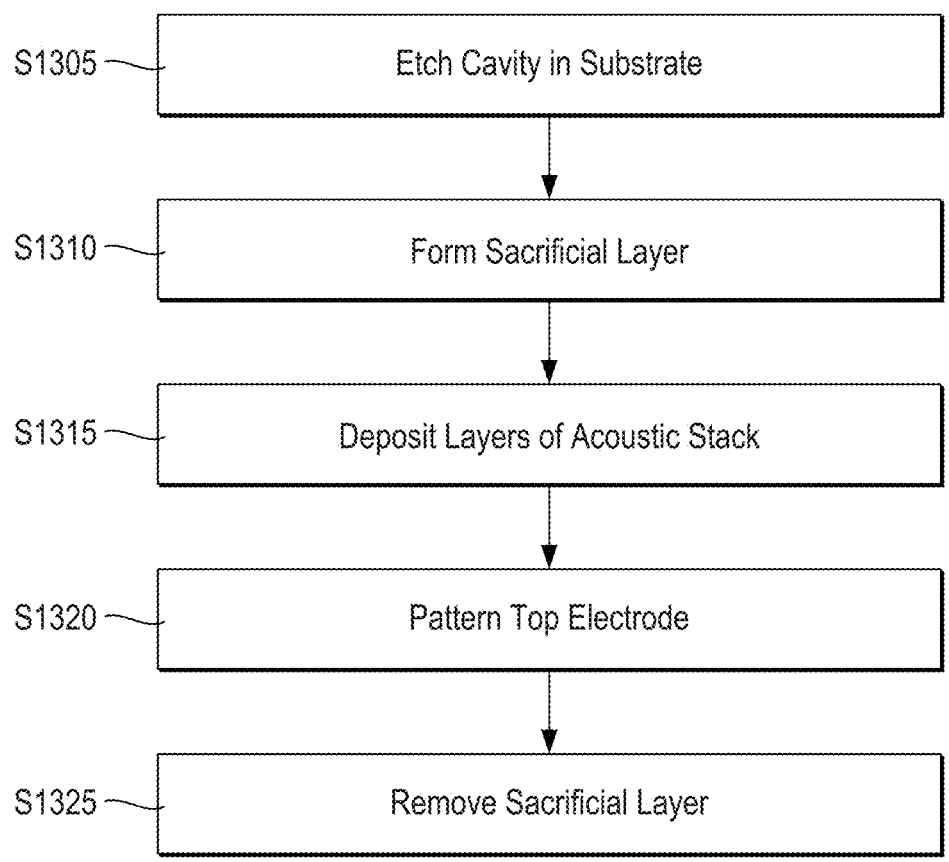
FIG. 13 is a flowchart illustrating a method of manufacturing an acoustic filter comprising two laterally-coupled resonators according to a representative embodiment.

FIG. 13 is a flowchart illustrating a method of manufacturing an acoustic filter comprising laterally-coupled resonators according to a representative embodiment. For explanation purposes, it will be assumed that the method of FIG. 13 is used to manufacture acoustic filter 100 of FIG. 1. However, this method could be adapted for manufacturing other embodiments. For example, modified etching and/or deposition processes could be used to form electrodes with apodized shape, mass loaded electrode buses, and so on. In addition, the method of FIG. 13 may use various known techniques in addition to those specifically described below. For example, additional layers may be formed for various reasons, e.g., passivation layers, photoresist layers, sacrificial layers. Moreover, the materials and techniques described in relation to FIG. 13 could be variously modified or substituted in ways that will be apparent to those skilled in the art and having the benefit of this description. In the description of FIG. 13, example method features are indicated by parentheses.

Referring to FIG. 13, the method comprises etching a cavity on the surface of substrate 305, which typically comprises a silicon wafer (S 1305). This pocket can be used subsequently to form air cavity 310. The cavity is typically formed with a depth of about six microns. Next, the cavity is filled with a sacrificial layer such as silicone dioxide, and the resulting structure is planarized (S1310). The silicon dioxide can be deposited using a known technique, such as chemical vapor deposition (CVD), for example.

Thereafter, a bottom electrode 105, piezoelectric layer 315, and a top layer are deposited in a sequence (S1315). Bottom electrode 105 and the top layer are typically formed of a conductive material such as tungsten or molybdenum, and they can be deposited with a thickness of about 6000 angstroms, for example. Piezoelectric layer 315 is typically formed of a piezoelectric material such as aluminum nitride or zinc oxide, and it can be deposited with a thickness of about 1.5 microns, for example.

Next, the top layer is patterned to form top electrode 110 (S1320) having fingers and electrode buses as illustrated in FIG. 1. The patterning is typically accomplished by an etching process such as photolithography, for example. The etching process can be performed with different shaped masks, for example, to create different electrode shapes such as the apodized shape illustrated in FIG. 10. Finally, the sacrificial layer is removed from the cavity in substrate 305 to form air cavity 310 (S1325). The sacrificial layer can be removed, for instance, using hydrofluoric acid. Additional steps such as packaging may be performed after acoustic filter 100 has been manufactured as described above.

While various embodiments are disclosed herein, one of ordinary skill in the art appreciates that many variations that are in accordance with the present teachings are possible and remain within the scope of the appended claim set. The embodiments therefore are not to be restricted except within the scope of the appended claims.

The invention claimed is:

1. An apparatus, comprising:
   a piezoelectric layer;
   a first acoustic resonator comprising first and second electrodes formed on opposite sides of the piezoelectric layer the first electrode of the first acoustic resonator comprising a first electrode bus connected to a first plurality of finger structures; and
   a second acoustic resonator comprising first and second electrodes formed on opposite sides of the piezoelectric layer and acoustically coupled to the first acoustic resonator, the first electrode of the second acoustic resonator comprising a second electrode bus connected to a second plurality of finger structures, wherein the respective second electrodes do not overlap either the first electrode bus, or the second electrode bus.

2. The apparatus of claim 1, wherein the first acoustic resonator is configured to receive a time-varying input signal and the second acoustic resonator is configured to transmit a time-varying, output signal that is related to the input signal according to a transfer function comprising a passband.

3. The apparatus of claim 2, wherein the second plurality of finger structures are arranged in an interdigital configuration with respect to the first plurality of finger structures.

4. The apparatus of claim 3, wherein the first and second pluralities of finger structures comprise fingers of different thicknesses.

5. The apparatus of claim 4, wherein outermost fingers among the first and second pluralities of finger structures have a greatest thickness among fingers of the first and second pluralities of finger structures.

6. The apparatus of claim 4, wherein next-outermost fingers among the first and second pluralities of finger structures have a smallest thickness among fingers of the first and second pluralities of finger structures.

7. The apparatus of claim 3, wherein the first and second pluralities of fingers have a first thickness, and the first and second electrode buses have a second thickness greater than the first thickness.

8. The apparatus of claim 7, wherein the second thickness is adapted to maintain a resonance associated with the first and second electrode buses away from the passband.

9. The apparatus of claim 3, wherein the respective second electrodes of the first and second acoustic resonators are connected to ground, the first electrode of the first acoustic resonator is connected to an input terminal configured to receive the input signal, and the first electrode of the second acoustic resonator is connected to an output terminal configured to transmit the output signal.

10. The apparatus of claim 3, wherein the first and second pluralities of finger structures comprise fingers of different widths or fingers separated by gaps of different sizes.

11. The apparatus of claim 3, wherein the second electrode of the first acoustic resonator comprises a third electrode bus connected to a third plurality of finger structures, and the second electrode of the second acoustic resonator comprises a fourth electrode bus connected to a fourth plurality of finger structures arranged in an interdigital configuration with respect to the third plurality of finger structures.

12. The apparatus of claim 1, wherein the respective first electrodes of the first and second acoustic resonators have an apodized shape.

13. The apparatus of claim 12, wherein the respective second electrodes of the first and second acoustic resonators have an apodized shape.

14. The apparatus of claim 1, wherein the first acoustic resonator is configured to receive an unbalanced input signal and the second acoustic resonator is configured to transmit a balanced output signal corresponding to the unbalanced input signal.

15. The apparatus of claim 14, wherein the first electrode of the first acoustic resonator is connected to an input terminal configured to receive the unbalanced input signal, the second electrode of the first acoustic resonator is connected to ground, the first electrode of the second acoustic resonator is connected to a first output terminal configured to transmit a first output signal, and the second electrode of the second acoustic resonator is connected to a second output terminal configured to transmit a second output signal, wherein the first and second output signals form a balanced signal pair.

16. The apparatus of claim 1, wherein the respective first electrodes of the first and second acoustic resonators are electrically separated from each other and the respective second electrodes of the first and second acoustic resonators are electrically connected to each other.

17. The apparatus of claim 1, wherein the respective first electrodes of the first and second acoustic resonators are formed from a common conductive layer and the respective second electrodes of the first and second electrodes are formed from a common conductive layer.

18. The apparatus of claim 1, further comprising a substrate having an air cavity, wherein the respective second electrodes of the first and second acoustic resonators are formed on the substrate over the air cavity.

19. The apparatus of claim 1, wherein portions of each of the first and second electrodes overlap with each other to define an active region, and the first and second electrode buses are located outside the active region.

20. An apparatus, comprising:
a piezoelectric layer;
a first acoustic resonator comprising first and second electrodes formed on opposite sides of the piezoelectric layer, the first electrode of the first acoustic resonator comprising a first electrode bus connected to a first plurality of finger structures; and
a second acoustic resonator comprising first and second electrodes formed on opposite sides of the piezoelectric layer and acoustically coupled to the first acoustic resonator, the first electrode of the second acoustic resonator comprising a second electrode bus connected to a second plurality of finger structures, wherein the respective first electrodes of the first and second acoustic resonators are electrically separated from each other, and the respective second electrodes of the first and second acoustic resonators are electrically connected to each other, and do not overlap either the first electrode bus or the second electrode bus.

21. An apparatus as claimed in claim 20, wherein portions of each of the first and second electrodes overlap with each other to define an active region, and the first and second electrode buses are located outside the active region.

22. An apparatus as claimed in claim 21, wherein the first and second pluralities of fingers have a first thickness, and the first and second electrode buses have a second thickness greater than the first thickness.

23. An apparatus as claimed in claim 22, wherein the second thickness is adapted to maintain a resonance associated with the first and second electrode buses away from the passband.

24. An apparatus as claimed in claim 20, wherein the respective second electrodes of the first and second acoustic resonators are connected to ground, the first electrode of the first acoustic resonator is connected to an input terminal configured to receive the input signal, and the first electrode of the second acoustic resonator is connected to an output terminal configured to transmit the output signal.

25. An apparatus, comprising:
a piezoelectric layer;
a first acoustic resonator comprising first and second electrodes formed on opposite sides of the piezoelectric layer, the first electrode of the first acoustic resonator comprising a first electrode bus connected to a first plurality of finger structures; and
a second acoustic resonator comprising first and second electrodes formed on opposite sides of the piezoelectric layer and acoustically coupled to the first acoustic resonator, the first electrode of the second acoustic resonator comprising a second electrode bus connected to a second plurality of finger structures arranged in an interdigital configuration with respect to the first plurality of finger structures, the first and second pluralities of fingers having a first thickness, and the first and second electrode buses having a second thickness greater than the first thickness, wherein the respective second electrodes do not overlap either the first electrode bus or the second electrode bus.

26. An apparatus as claimed in claim 25, wherein the second thickness is adapted to maintain a resonance associated with the first and second electrode buses away from the passband.

27. An apparatus as claimed in claim 26, wherein the respective second electrodes of the first and second acoustic resonators are connected to ground, the first electrode of the first acoustic resonator is connected to an input terminal configured to receive the input signal, and the first electrode of the second acoustic resonator is connected to an output terminal configured to transmit the output signal.

28. An apparatus as claimed in claim 25, wherein portions of each of the first and second electrodes overlap with each other to define an active region, and the first and second electrode buses are located outside the active region.

29. A method of manufacturing an acoustic resonator pair, comprising:
- forming a bottom electrode on a substrate:
- forming a piezoelectric layer on the bottom electrode;
- forming a top electrode on the piezoelectric layer; and
- patterning the top electrode to form a first electrode bus connected to a first plurality of finger structures and a second electrode bus connected to a second plurality of finger structures arranged in an interdigital configuration with respect to the first plurality of finger structures; and
- removing a portion of the e bottom electrode from a region that overlaps the first and second electrode buses.

30. The method of claim 29, further comprising:
- patterning the bottom electrode to form a third electrode bus connected to a third plurality of finger structures and a fourth electrode bus connected to a fourth plurality of finger structures arranged in an interdigital configuration with respect to the third plurality of finger structures.

31. The method of claim 29, further comprising, forming the first and second electrode buses with a thickness greater than a thickness of the first and second pluralities of finger structures.

32. The method of claim 29, further comprising forming fingers among the first and second pluralities of finger structures with different thicknesses.

* * * * *